(12) United States Patent  
Ogura

(10) Patent No.: US 10,104,779 B2  
(45) Date of Patent: Oct. 16, 2018

(54) STRETCHABLE CIRCUIT BOARD

(71) Applicant: FUJIKURA LTD., Tokyo (JP)

(72) Inventor: Shingo Ogura, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/547,906

(22) PCT Filed: Jan. 28, 2016

(86) PCT No.: PCT/JP2016/052446  
§ 371 (c)(1),  
(2) Date: Aug. 1, 2017

(87) PCT Pub. No.: WO2016/125670  
PCT Pub. Date: Aug. 11, 2016

(65) Prior Publication Data  
US 2018/0027661 A1    Jan. 25, 2018

(30) Foreign Application Priority Data

Feb. 2, 2015    (JP) .................................. 2015-018479

(51) Int. Cl.  
*H05K 1/00* (2006.01)  
*H05K 1/18* (2006.01)  
*H05K 1/02* (2006.01)

(52) U.S. Cl.  
CPC .......... *H05K 1/189* (2013.01); *H05K 1/0277* (2013.01); *H05K 1/0283* (2013.01)

(58) Field of Classification Search  
CPC ..... H05K 1/189; H05K 1/0283; H05K 1/0277  
See application file for complete search history.

(56) References Cited

U.S. PATENT DOCUMENTS 6,506,978 B1 * 1/2003 Furihata .............. G02F 1/13452  
174/254  
9,089,050 B2   7/2015 Kajiya  
(Continued)

FOREIGN PATENT DOCUMENTS

EP         0 469 614 A1    2/1992  
JP         2012-33597 A    2/2012  
(Continued)

OTHER PUBLICATIONS

International Search Report dated Apr. 26, 2016, issued in counterpart International Application No. PCT/JP2016/052446 (2 pages).

(Continued)

*Primary Examiner* — Steven T Sawyer  
(74) *Attorney, Agent, or Firm* — Westerman, Hattori, Daniels & Adrian, LLP

(57) ABSTRACT

A stretchable circuit board includes: a stretchable base; a stretchable wiring formed on the stretchable base; an electronic component mounted on the stretchable base; and a connecting section that electrically connects between the electronic component and the stretchable wiring, and is stretchable and formed such that its Young's modulus is greater than or equal to that of the stretchable wiring. In addition, the stretchable circuit board includes a stretchable insulating film formed on the stretchable base and the stretchable wiring excluding a place where the connecting section is formed.

8 Claims, 4 Drawing Sheets

A-A' Cross Section

(56) References Cited

U.S. PATENT DOCUMENTS

| | | | |
|---|---|---|---|
| 2008/0257589 A1 | 10/2008 | Ostmann et al. | |
| 2010/0238636 A1 | 9/2010 | Mascaro et al. | |
| 2012/0026700 A1* | 2/2012 | Furuta ................... | H05K 3/361 |
| | | | 361/750 |
| 2016/0270223 A1* | 9/2016 | Cherenack ........... | H05K 1/0283 |

FOREIGN PATENT DOCUMENTS

| | | |
|---|---|---|
| JP | 2012-113851 A | 6/2012 |
| JP | 2013-145842 A | 7/2013 |
| TW | 216468 B | 11/1993 |
| TW | 201220975 A | 5/2012 |

OTHER PUBLICATIONS

Office Action dated Aug. 16, 2017, issued in counterpart Taiwanese Application No. 105103315. (7 pages).

Extended (supplementary) European Search Report dated Feb. 5, 2018, issued in counterpart European Application No. 16746501.2. (8 pages).

* cited by examiner

A-A' Cross Section

B-B' Cross Section

C-C' Cross Section

D-D' Cross Section

E-E' Cross Section

STRETCHABLE CIRCUIT BOARD

TECHNICAL FIELD

This invention relates to a stretchable circuit board mounted with an electronic component, and, in particular, relates to a stretchable circuit board that enables high density mounting of the electronic component while securing stretchability and flexibility of the board overall.

BACKGROUND ART

In recent years, stretchable circuit boards capable of stretching in a curving manner or a planar manner, have been developed. For example, a flexible circuit board (refer to Patent Document 1 listed below) is known as one of these stretchable circuit boards. This flexible circuit board has a stretchable circuit body in which a stretchable insulating base material is provided with a stretchable wiring section. In addition, this flexible circuit board has a non-stretchable component mounting board laminated in a certain region of the stretchable circuit body. Furthermore, this flexible circuit board has an electrical connecting section that electrically connects a wiring section of the component mounting board and the wiring section of the stretchable circuit body.

Moreover, the component mounting board is provided with a stretch-preventing guard that prevents stretching of a region including the electrical connecting section of the stretchable circuit body. As a result, in the flexible circuit board, stretching of a portion of the electrical connecting section in the wiring section of the stretchable circuit body is prevented by the stretch-preventing guard of the component mounting board.

PRIOR ART DOCUMENT

Patent Document

Patent Document 1: JP 2013-145842 A

DISCLOSURE OF INVENTION

Problem to be Solved by the Invention

In this way, the flexible circuit board of the conventional technology disclosed in the above-listed Patent Document 1 has a structure where, due to the stretch-preventing guard provided in the component mounting board, stress due to stretching does not occur in the electrical connecting section. Therefore, breaking due to stress of the electrical connecting section can be suppressed, and connection reliability of the component mounting board and the stretchable circuit body can be secured.

However, in the flexible circuit board of the conventional technology, there is a problem that, due to the stretch-preventing guard which is hard existing on the board, stretchability of the board overall gets impaired, and stretchability or flexibility deteriorates. Moreover, there is a risk that, since the stretch-preventing guard is provided on the component mounting board more to an outer side of the board than the electrical connecting section, a substantive mounting area of the electronic component on the board increases, leading to a deterioration of mounting density.

This invention has an object of solving the above-mentioned problems due to the conventional technology, and providing a stretchable circuit board that secures stretchability and flexibility of the board overall and enables high density mounting of an electronic component.

Means for Solving the Problem

A stretchable circuit board according to the present invention is characterized in including: a stretchable base; a stretchable wiring formed on the stretchable base; an electronic component mounted on the stretchable base; and a connecting section that electrically connects between the electronic component and the stretchable wiring, and is stretchable and formed such that its Young's modulus is greater than or equal to that of the stretchable wiring.

Due to the stretchable circuit board according to the present invention, a connecting section electrically connecting an electronic component and a stretchable wiring is stretchable and formed such that its Young's modulus is greater than or equal to that of the stretchable wiring, hence the following working effects can be displayed. That is, (1) when the stretchable circuit board stretches, first, the stretchable wiring stretches, and, simultaneously to this or after stretching, the connecting section stretches thereby deforming. As a result, a stress normally applied to the connecting section is dispersed to an entire surface of the board. Therefore, breaking of the connecting section can be suppressed without stretchability of the stretchable circuit board overall being impaired. In addition, (2) breaking of the connecting section can be suppressed by stretchability of the connecting section itself, without a conventional kind of hard stretch-preventing guard being provided on the board. Therefore, deterioration of stretchability and flexibility of the stretchable circuit board overall can be suppressed. In this way, the above-described working effects of (1) and (2) make it possible to secure stretchability and flexibility of the stretchable circuit board overall.

In one embodiment of the present invention, the connecting section is formed such that its Young's modulus is less than 1 GPa and two or more times the Young's modulus of the stretchable wiring.

In another embodiment of the present invention, there is further included a covering section formed so as to cover at least the connecting section, and the covering section is formed such that its Young's modulus is higher than the Young's modulus of the connecting section. Since a stretching amount of the connecting section during stretching of the stretchable circuit board can be relieved by the covering section, concentration of stress can be suppressed. Moreover, the connecting section is able to be protected by the covering section being provided in a state of being contacted on the connecting section, without a member like the conventional stretch-preventing guard being provided in a state of being separated more to an outer side in a planar direction than the connecting section with respect to the electronic component. Therefore, substantive mounting area of the electronic component on the board can be reduced, and high density mounting of the electronic component is enabled.

In yet another embodiment of the present invention, the covering section is formed such that its Young's modulus is less than 1 GPa and two or more times the Young's modulus of the connecting section.

In yet another embodiment of the present invention, the covering section is formed so as to continuously wrap around a spatial region between a mounting surface of the electronic component and the stretchable base, from a place covering a side surface of the electronic component, so as to fill at least part of the spatial region and cover at least the connecting section.

In yet another embodiment of the present invention, the connecting section is formed by a mixture of a first elastomer and a first conductive material.

In yet another embodiment of the present invention, the stretchable wiring is formed by a mixture of a second elastomer and a second conductive material.

In yet another embodiment of the present invention, the Young's modulus of the first elastomer is higher than the Young's modulus of the second elastomer.

In yet another embodiment of the present invention, the Young's modulus of the first conductive material is higher than the Young's modulus of the second conductive material.

Effect of the Invention

Due to the present invention, the connecting section electrically connecting the electronic component and the stretchable wiring is formed such that its Young's modulus is greater than or equal to that of the stretchable wiring, hence stretchability and flexibility of the stretchable circuit board overall can be secured.

MODES FOR CARRYING OUT THE INVENTION

Stretchable circuit boards according to embodiments of this invention will be described in detail below with reference to the accompanying drawings.

First Embodiment

Figure 1:
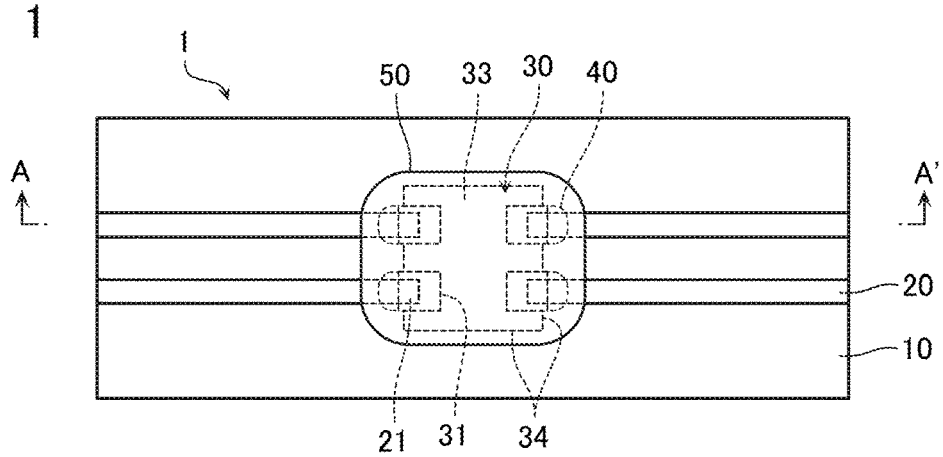
FIG. 1 is a plan view showing a stretchable circuit board according to a first embodiment of the present invention.
Figure 2:
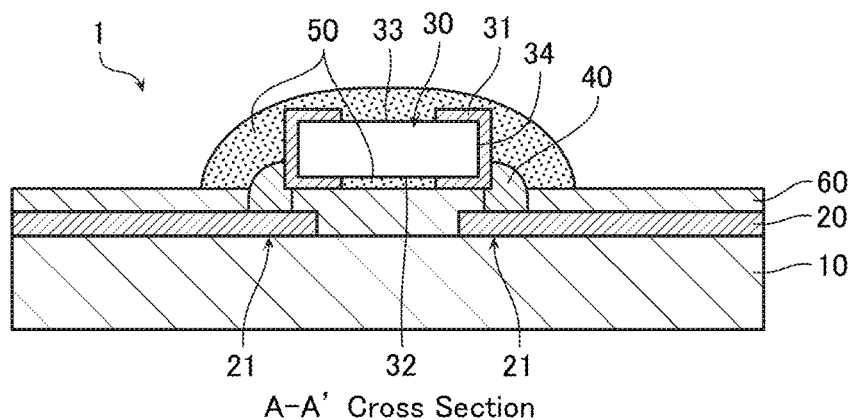
FIG. 2 is a cross-sectional view taken along the line A-A' of FIG. 1.
Figure 3:
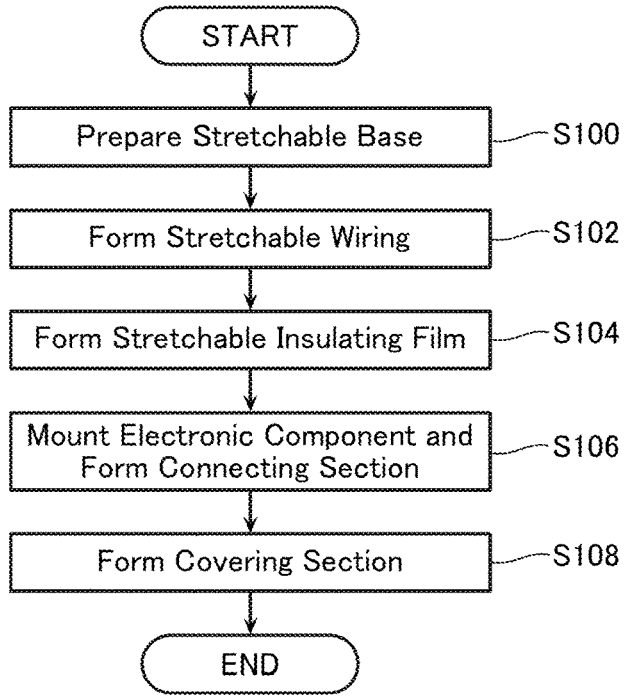
FIG. 3 is a flowchart showing manufacturing steps of the same stretchable circuit board.

FIG. 1 is a plan view showing a stretchable circuit board 1 according to a first embodiment of the present invention, and FIG. 2 is a cross-sectional view taken along the line A-A' of FIG. 1. Moreover, FIG. 3 is a flowchart showing manufacturing steps of the stretchable circuit board 1.

As shown in FIGS. 1 and 2, the stretchable circuit board 1 according to the first embodiment includes: a stretchable base 10; and a stretchable wiring 20 formed on this stretchable base 10. In addition, the stretchable circuit board 1 includes: an electronic component 30 mounted on the stretchable base 10; and a connecting section 40 that electrically connects between a connecting terminal 31 of this electronic component 30 and a wiring terminal 21 of the stretchable wiring 20.

Furthermore, the stretchable circuit board 1 includes a covering section 50 formed so as to cover a certain region on the stretchable base 10 including the electronic component 30, the connecting section 40, and the wiring terminal 21 of the stretchable wiring 20, for example. Note that the stretchable circuit board 1 of the present embodiment is configured further including a stretchable insulating film 60 formed on the stretchable base 10 and the stretchable wiring 20 excluding a place where the connecting section 40 is formed. Illustration of this stretchable insulating film 60 is omitted in FIG. 1.

The stretchable base 10 is configured by a stretchable material, and is configured from, for example, an elastomer sheet or a fiber. The following may be employed as an elastomer, namely, the likes of styrene rubber, styrene-butadiene rubber, butyl rubber, chloroprene rubber, acrylic rubber, urethane rubber, silicone rubber, and fluororubber, for example. Other elastomer materials may also be used.

Moreover, the following may be employed as the fiber, namely the likes of rayon, nylon, polyester, acryl, polyurethane, vinylon, polyethylene, Nafion, aramid, and cotton, for example. The stretchable material is not limited to those described above. Note that in the embodiments according to the present invention, being stretchable is exemplified by each material having a Young's modulus of less than 1 GPa. Therefore, a material is assumed to stretch if its Young's modulus is less than 1 GPa, and is assumed not to stretch if its Young's modulus is 1 GPa or more.

Moreover, a stretchable base whose Young's modulus is less than 1 GPa is usable as the stretchable base 10. Specifically, the stretchable base 10 is preferably configured by a material having a Young's modulus of not less than 0.1 MPa and not more than 100 MPa, and from a substantive viewpoint, a Young's modulus of not less than 1 MPa and not more than 100 MPa. Furthermore, most preferably, it is configured by a material having a Young's modulus of not less than 1 MPa and not more than 30 MPa.

The stretchable wiring 20 is configured by a stretchable wiring material, and is configured from a mixture of, for example, the above-mentioned elastomer material and a conductive material (conductive solid). The following may be employed as the conductive material, namely, for example, a metal such as silver, copper, nickel, tin, bismuth, aluminum, gold, palladium, or the like, graphite, a conductive polymer, and so on.

Moreover, various kinds of conventional publicly known stretchable wirings (for example, a stretchable wiring disclosed in JP 2010-539650 W) may be employed as the stretchable wiring 20. The Young's modulus of the stretchable wiring 20 is preferably not less than 10 MPa and not more than 500 MPa, and more preferably not less than 30 MPa and not more than 70 MPa. Moreover, the Young's modulus of the stretchable wiring 20 is preferably higher (larger) than the Young's modulus of the stretchable base 10.

Note that the conductive polymer is a so-called conductive polymer that conducts electricity, and has a characteristic of being capable of electrolytic stretching by oxidation-reduction. Moreover, other conductive materials may also be used in the stretchable wiring 20. Note that it is also possible to employ a standard conductive material as a conductive adhesive agent having flexibility, as a conductive material employing a metal solid, for example. In addition, the stretchable wiring 20 may also be configured by the likes of a metal wiring formed in a meandering shape or a metal wiring formed in a bellows shape, for example. The stretchable wiring 20 includes the wiring terminal 21 which is a connecting portion with the electronic component 30.

The electronic component 30 is configured by a non-stretchable hard component, and is configured from, for example, an active component of a semiconductor element of the likes of a transistor, integrated circuit (IC), or diode, or a passive component of the likes of a resistor, capacitor, relay, or piezoelectric element. The electronic component 30 includes: a mounting surface 32 facing the stretchable base 10; a back surface 33 on an opposite side to this mounting surface 32; and a side surface 34 continuous with these mounting surface 32 and back surface 33. In addition, the electronic component 30 includes the connecting terminal 31 formed so as to be continuous from a certain place (here, two places each) of a pair of the side surfaces 34 to part of the mounting surface 32 and the back surface 33.

The connecting section 40 electrically connects the wiring terminal 21 of the stretchable wiring 20 and the connecting terminal 31 of the electronic component 30 in a form of being joined one-to-one. The connecting section 40 of the present embodiment individually electrically connects each wiring terminal 21 of the stretchable wiring 20 and a connecting portion in a range from part of the connecting terminal 31 on a mounting surface 32 side to part of the connecting terminal 31 on a side surface 34 side of the electronic component 30.

The connecting section 40 is configured by a stretchable connecting material. Specifically, the connecting section 40 is configured from a mixture of the elastomer material and the conductive material similar to those of the above-mentioned stretchable wiring 20, and is configured so as to have a Young's modulus greater than or equal to that of the stretchable wiring 20. Therefore, although the connecting section 40 may be configured by a connecting material having the same Young's modulus as the stretchable wiring 20, more preferably, the connecting section 40 should be configured from a connecting material whose Young's modulus differs from that of the stretchable wiring 20.

That is, the connecting section 40 is preferably formed such that its Young's modulus is less than 1 GPa and two or more times the Young's modulus of the stretchable wiring 20. Specifically, the likes of a mixture employing a conductive material whose Young's modulus is higher than that of the wiring material of the stretchable wiring 20 or a mixture similarly including a large amount of a conductive material of high Young's modulus, may be cited.

Moreover, the connecting section 40 may also use a mixture employing an elastomer material whose Young's modulus is higher than that of the elastomer material of the stretchable wiring 20. In addition, it is also possible to employ a standard elastomer material as a conductive adhesive agent having flexibility similarly to in the stretchable wiring 10. The Young's modulus of the connecting section 40 is preferably not less than 50 MPa and less than 1000 MPa, and more preferably not less than 70 MPa and not more than 300 MPa.

The stretchable insulating film 60 covers and thereby insulates above the stretchable base 10 and the stretchable wiring 20, excluding at least a place of connection to the connecting section 40 in the wiring terminal 21 of the stretchable wiring 20. This stretchable insulating film 60 is stretchable and may be configured by an elastomer material similar to that of the above-mentioned stretchable base 10. In addition, it is also possible to employ a standard adhesive tape material or a liquid material capable of being coated, as the stretchable insulating film 60.

The covering section 50 is provided so as to cover at least the connecting section 40, and plays a protective role by preventing exposure of the connecting section 40. The covering section 50 is configured by a stretchable material, and can employ a liquid material similar to in the above-mentioned stretchable insulating film 60. In addition, the covering section 50 may also employ a sealing agent having flexibility configured from a standard liquid raw material or a material for an electronic component such as an insulating material, a coating agent, and so on.

In the present embodiment, the covering section 50, in a state where it covers all of the side surface 34 and the back surface 33 of the electronic component 30 including the connecting section 40 and fills a spatial region between the mounting surface 32 of the electronic component 30 and the stretchable base 10, is formed so as to, for example, continuously wrap around the above-mentioned spatial region from a place covering the side surface 34 of the electronic component 30, and is provided so as to entirely cover the above-mentioned certain region. Note that the covering section 50 formed in the above-described spatial region plays a role of adhering the electronic component 30 and the stretchable base 10. This covering section 50 may be formed so as to fill at least part of the above-mentioned spatial region.

The covering section 50 is preferably formed such that its Young's modulus is higher than the Young's modulus of the connecting section 40. However, if the Young's modulus of the covering section 50 is too high, working effects of the present invention end up weakening, hence the Young's modulus of the covering section 50 is preferably less than 1 GPa and two or more times the Young's modulus of the connecting section 40.

Note that the covering section 50 is optimally configured so as to have the largest Young's modulus among each of the sections configuring the stretchable circuit board 1 such as the stretchable base 10, the stretchable wiring 20, the connecting section 40, and the stretchable insulating film 60.

In addition, the covering section 50 may be configured by different flexible materials, under the above-mentioned Young's modulus conditions. That is, different materials may be purposely used in the likes of a portion covering the connecting section 40, a portion covering the side surface 34 and the back surface 33 of the electronic component 30, and a portion filling the above-described spatial region. In this case, the covering section 50 is preferably configured such that the portion covering the connecting section 40 has a higher Young's modulus than the other portions. The Young's modulus of the covering section 50 is preferably not less than 100 MPa and less than 1000 MPa, and more preferably not less than 100 MPa and not more than 500 MPa.

The stretchable circuit board 1 according to the first embodiment configured in this way is configured such that the connecting section 40 electrically connecting the electronic component 30 and the stretchable wiring 20 is stretchable and has a Young's modulus which is greater than or equal to that of the stretchable wiring 20. As a result, working effects like the following (1) and (2) are displayed.

That is, (1) when the stretchable circuit board 1 stretches, first, the stretchable wiring 20 stretches, and, simultaneously to this or after stretching, the connecting section 40 stretches thereby deforming. As a result, a stress due to stretching normally applied to the connecting section 40 can be dispersed to an entire surface of the board, via the stretchable wiring 20 and the connecting section 40. Therefore, stretchability or flexibility of the stretchable circuit board 1 overall can be secured, and breaking of the connecting section 40 can be prevented.

In addition, (2) breaking of the connecting section 40 can be suppressed by stretchability of the connecting section 40 itself, without a conventional kind of hard stretch-preventing guard being provided on the board. Usually, when a stretching amount of the connecting section 40 decreases, stress generated in the connecting section 40 increases, hence if there is no stretchability in the connecting section 40 as conventionally, then a concentration of stress on the connecting section 40 is generated, whereby breaking of the connecting section 40 ends up occurring. In this regard, since the connecting section 40 itself of the stretchable circuit board 1 is stretchable, deterioration of stretchability or flexibility of the stretchable circuit board 1 overall can be suppressed. Furthermore, the covering section 50, although being stretchable, is harder than the connecting section 40, hence stress generated in the connecting section 40 ends up being borne by the covering section 50 which is the hardest material in a periphery of the connecting section 40. As a result, the stretching amount of the connecting section 40 during stretching can be relieved, and concentration of stress on the connecting section 40 can be suppressed. Moreover, since this renders unnecessary a member provided in a state of being separated to an outer side in a planar direction from the electronic component 30 like a stretch-preventing guard in a flexible circuit board of the conventional technology, substantive mounting area of the electronic component can be reduced, and high density mounting is enabled.

[Manufacturing Steps of Stretchable Circuit Board]

Next, manufacturing steps of the stretchable circuit board 1 will be described with reference to FIG. 3.

First, the stretchable base 10 is prepared (step S100). A stretchable base 10 whose insulating properties are insufficient should have a standard stretchable insulating material coated in advance on a surface of the stretchable base 10. Now, for example, a silicone rubber sheet whose Young's modulus is about 10 MPa is employed as the stretchable base 10.

Next, the stretchable wiring 20 of a desired pattern is formed on the stretchable base 10 (step S102). Now, the stretchable wiring 20 is formed by, for example, patterning an ink-like conductive composition (mixture) in a desired shape on the stretchable base 10, and hardening by performing heat treatment or electromagnetic wave irradiation treatment (hardening treatment). In this step S102, for example, a conductive adhesive agent having a Young's modulus of about 40 MPa including silver and having silicone rubber as a binder, is employed as the mixture. Moreover, the likes of a screen printing method, a dispense method, or a gravure printing method is employed as a patterning method.

Then, the stretchable insulating film 60 is formed by, for example, patterning an ink-like insulative composition in a desired shape on the stretchable base 10 and the stretchable wiring 20 and performing the above-described kind of hardening treatment (step S104). A patterning method in this step S104 is similar to the patterning method in the above-described step S102.

Next, the electronic component 30 is mounted in a certain place on the stretchable base 10, and the connecting section 40 is formed (step S106). Now, a standard electronic component mounting device (a mounter) is employed to dispose the electronic component 30 such that the connecting terminal 31 and the wiring terminal 21 correspond. Moreover, the connecting section 40 is formed by dripping an ink-like conductive composition (mixture) on these connecting portions by a dispense method and performing the above-described kind of hardening treatment.

A conductive adhesive agent having a Young's modulus of 100 MPa is employed as the connecting section 40 formed in this step S106. Note that in this step S106, it is possible to configure such that the mixture is dripped in advance on a connecting portion of the wiring terminal 21, after which the electronic component 30 is mounted and the hardening treatment performed to form the connecting section 40.

Finally, the covering section 50 is formed (step S108). In this step S108, first, for example, (a) an ink-like insulative composition is dripped by a dispense method so as to cover the connecting section 40 and hardened by a hardening treatment. Silicone rubber having a Young's modulus of 300 MPa, for example, is employed as the insulative composition.

Moreover, (b) an ink-like insulative composition is filled into the spatial region between the mounting surface 32 of the electronic component 30 and the stretchable base 10 by being dripped on the spatial region and being left or subjected to heating or reduced pressure treatment, after which it is hardened by a hardening treatment. In addition, (c) an ink-like insulative composition is dripped so as to surround all of the side surface 34 of the electronic component 30, and hardened by a hardening treatment.

Moreover, (d) an ink-like insulative composition is dripped on the back surface 33 of the electronic component 30 and hardened by a hardening treatment. In this way, in step S108, the above-described treatments of (a) to (d) are undergone to form the covering section 50. These treatments of (a) to (d) are effective when, as mentioned above, the covering section 50 is configured by a different stretchable material for each place of formation.

In the above-described step S108, the covering section 50 may be formed omitting any of the above-described treatments of (a) to (d), or it may be configured such that the covering section 50 is formed by performing the above-described treatments of (a) to (d) all at once. Due to these kinds of manufacturing steps, the stretchable circuit board 1 according to the present embodiment is manufactured.

Note that in the flexible circuit board of the conventional technology, it was required to dispose a stretch-preventing guard, hence there was a problem that the number of manufacturing steps of the circuit board ended up increasing. In this regard, the stretchable circuit board 1 of the present embodiment does not require the conventional stretch-preventing guard and can be manufactured by the above-described kinds of simple steps, hence it becomes possible to prevent increase in the number of manufacturing steps.

Second Embodiment

Figure 4:
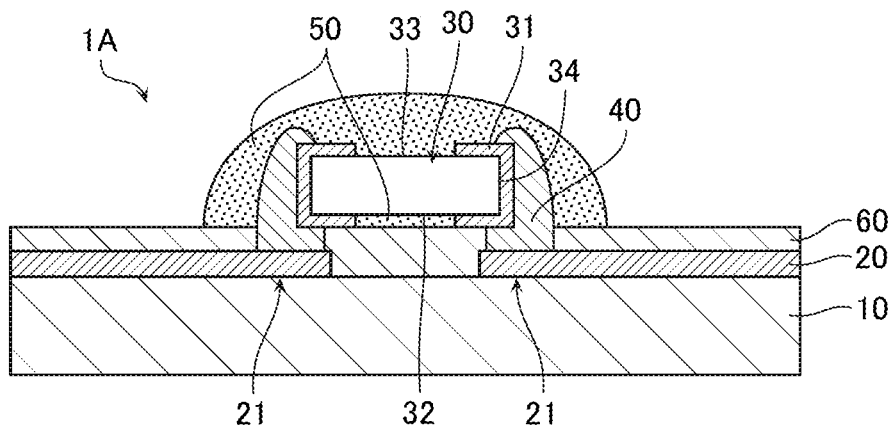
FIG. 4 is a cross-sectional view showing a stretchable circuit board according to a second embodiment of the present invention.

FIG. 4 is a cross-sectional view showing a stretchable circuit board 1A according to a second embodiment of the present invention. In FIG. 4, configuring elements identical to those of the first embodiment will be assigned with reference numerals identical to those assigned in the first embodiment, hence duplicated descriptions thereof will be omitted below.

As shown in FIG. 4, in the stretchable circuit board 1A according to the second embodiment, the connecting section 40 is formed so as to cover also to part of a back surface 33 side of the connecting terminal 31 of the electronic component 30. This differs from the connecting section 40 being formed so as to cover only a lower end of the connecting terminal 31 in the stretchable circuit board 1 of the above-mentioned first embodiment.

This kind of configuration also enables similar working effects to those of the stretchable circuit board 1 of the first embodiment to be displayed.

Third Embodiment

Figure 5:
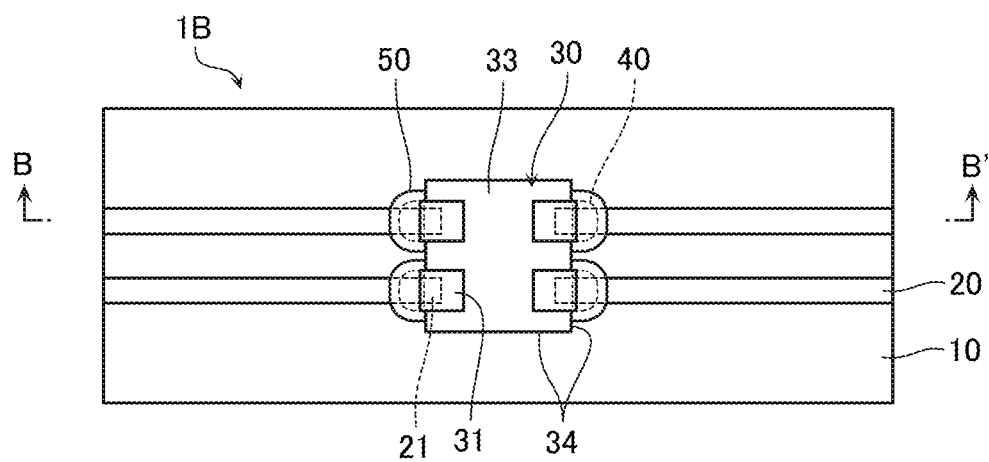
FIG. 5 is a plan view showing a stretchable circuit board according to a third embodiment of the present invention.
Figure 6:
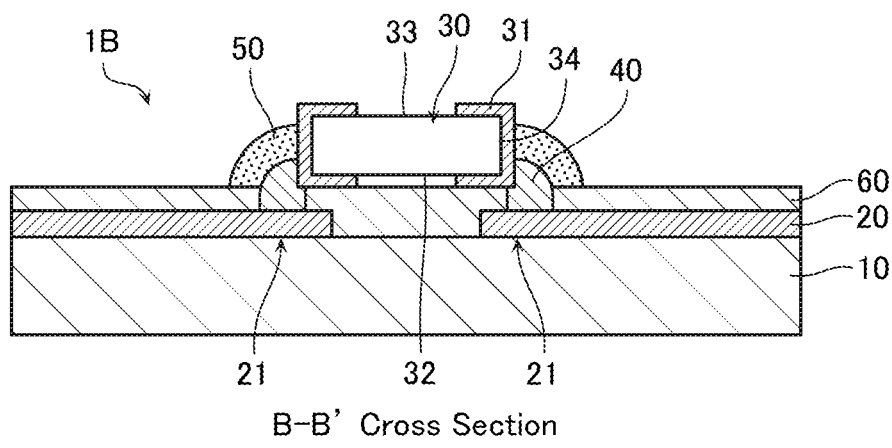
FIG. 6 is a cross-sectional view taken along the line B-B' of FIG. 5.

FIG. 5 is a plan view showing a stretchable circuit board 1B according to a third embodiment of the present invention. Moreover, FIG. 6 is a cross-sectional view taken along the line B-B' of FIG. 5. Note that in FIG. 5, illustration of the stretchable insulating film 60 is omitted. Note that in FIGS. 5 and 6, configuring elements identical to those of the first embodiment will be assigned with reference numerals identical to those assigned in the first embodiment, hence duplicated descriptions thereof will be omitted below.

As shown in FIGS. 5 and 6, in the stretchable circuit board 1B according to the third embodiment, the covering section 50 covers only a portion where the connecting section 40 is formed, and is formed such that an upper surface of other than the connecting section 40 on the stretchable base 10 is exposed. This differs from a member other than the connecting section 40 also being covered by the covering section 50 in the stretchable circuit board 1 of the above-mentioned first embodiment. That is, the covering section 50 is formed in a periphery of the connecting section 40 so as to cover the connecting section 40 such that the connecting section 40 is not exposed to the outside.

Therefore, the covering section 50 covers also part of a side wall of the electronic component 30 (part of a side wall of the connecting terminal 31). Moreover, the covering section 50 covers also part of a region on the stretchable base 10 to an outer side of the board in a planar direction in the case where the connecting sections 40 are each assumed central. This kind of configuration also enables high density mounting of the electronic component 30 while securing stretchability and flexibility of the stretchable circuit board 1B overall.

Fourth Embodiment

Figure 7:
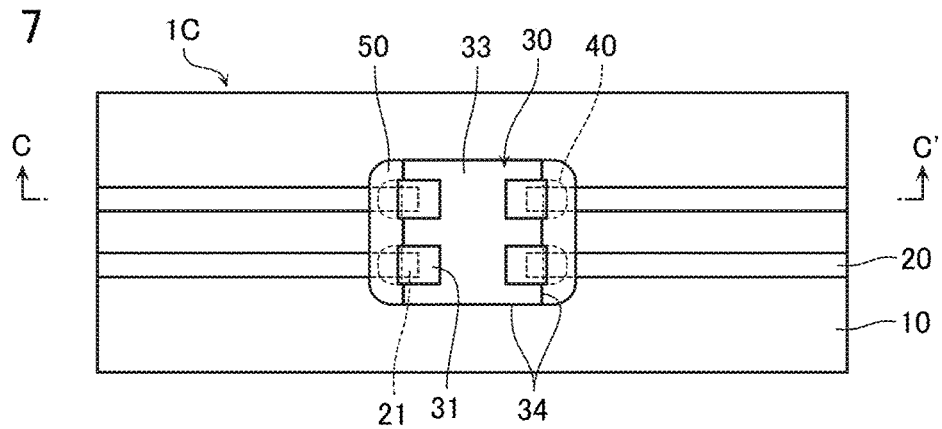
FIG. 7 is a plan view showing a stretchable circuit board according to a fourth embodiment of the present invention.
Figure 8:
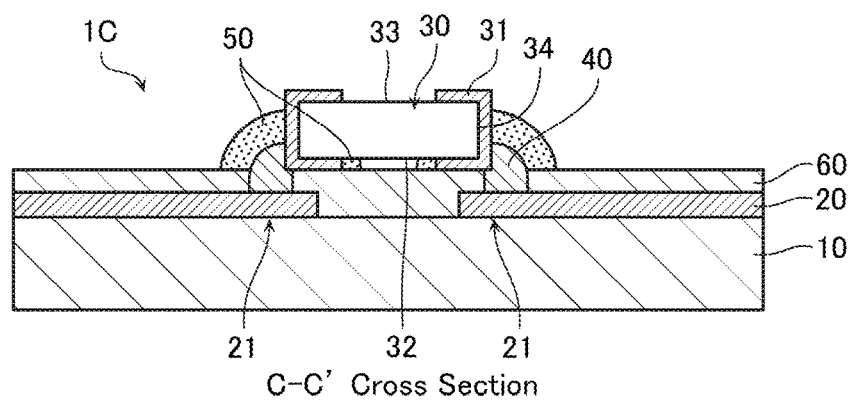
FIG. 8 is a cross-sectional view taken along the line C-C' of FIG. 7.

FIG. 7 is a plan view showing a stretchable circuit board 1C according to a fourth embodiment of the present invention. Moreover, FIG. 8 is a cross-sectional view taken along the line C-C' of FIG. 7. Note that in FIG. 7, illustration of the stretchable insulating film 60 is omitted. In FIGS. 7 and 8, configuring elements identical to those of the third embodiment will be assigned with reference numerals identical to those assigned in the third embodiment, hence duplicated descriptions thereof will be omitted below.

As shown in FIGS. 7 and 8, in the stretchable circuit board 1C according to the fourth embodiment, one covering section 50 is formed so as to commonly cover a plurality of the connecting sections 40 formed along one side surface 34 of the electronic component 30. This differs from one covering section 50 being formed so as to cover only one connecting section 40 in the stretchable circuit board 1B of the above-mentioned third embodiment.

Note that, as shown in FIG. 8, the covering section 50 may be formed such that part that has protruded in a period from dripping to hardening treatment exists in the spatial region between the mounting surface 32 of the electronic component 30 and the stretchable base 10. That is, the covering section 50 is formed so as to continuously wrap around the spatial region from a place covering the side surface 34 of the electronic component 30, and fill part of the spatial region. This kind of configuration also enables high density mounting of the electronic component 30 while securing stretchability and flexibility of the stretchable circuit board 1C overall.

Fifth Embodiment

Figure 9:
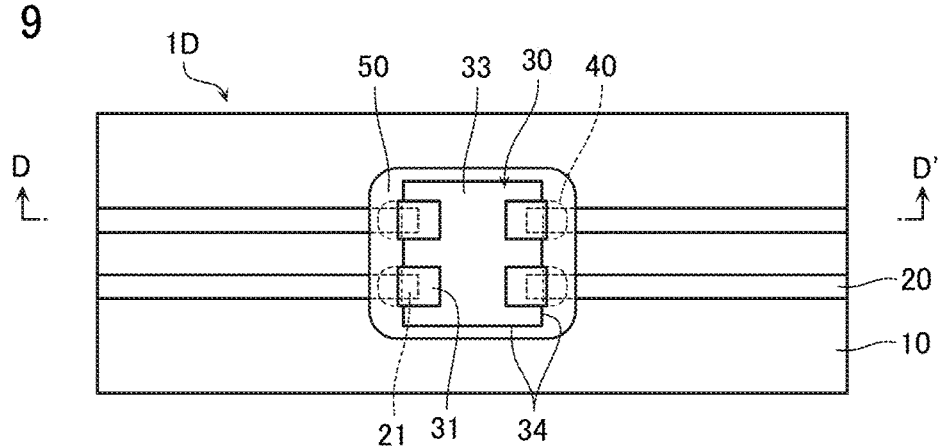
FIG. 9 is a plan view showing a stretchable circuit board according to a fifth embodiment of the present invention.
Figure 10:
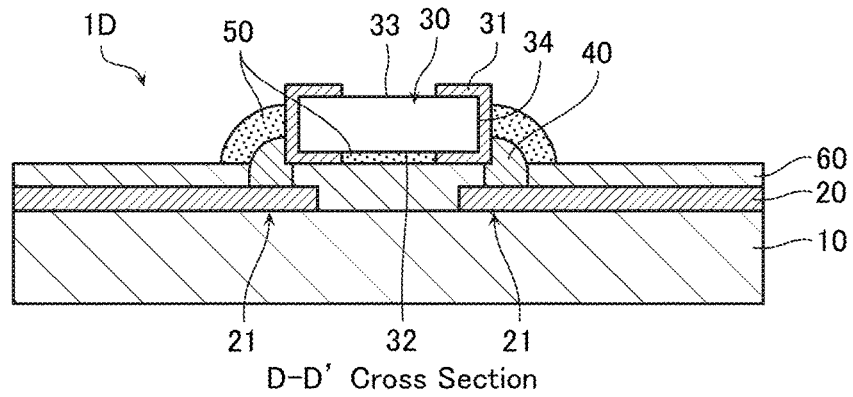
FIG. 10 is a cross-sectional view taken along the line D-D' of FIG. 9.

FIG. 9 is a plan view showing a stretchable circuit board 1D according to a fifth embodiment of the present invention. Moreover, FIG. 10 is a cross-sectional view taken along the line D-D' of FIG. 9. Note that in FIG. 9, illustration of the stretchable insulating film 60 is omitted. In FIGS. 9 and 10, configuring elements identical to those of the fourth embodiment will be assigned with reference numerals identical to those assigned in the fourth embodiment, hence duplicated descriptions thereof will be omitted below.

As shown in FIGS. 9 and 10, in the stretchable circuit board 1D according to the fifth embodiment, the covering section 50 is formed so as to cover a periphery of the electronic component 30 along all of the side surfaces 34 of the electronic component 30. Moreover, the covering section 50 is formed so as to fill also the spatial region between the mounting surface 32 of the electronic component 30 and the stretchable base 10. That is, the covering section 50 is formed so as to continuously wrap around the spatial region from a place covering the side surface 34 of the electronic component 30, and is formed so as to entirely fill the spatial region. These differ from one covering section 50 being formed so as to commonly cover a plurality of the connecting sections 40 of one side surface 34 in the stretchable circuit board 1C of the above-mentioned fourth embodiment.

This kind of configuration also enables stretchability and flexibility of the stretchable circuit board 1D overall to be secured, enables high density mounting of the electronic component 30, and enables the electronic component 30 to be reliably mounted on the stretchable circuit board 1D.

Sixth Embodiment

Figure 11:
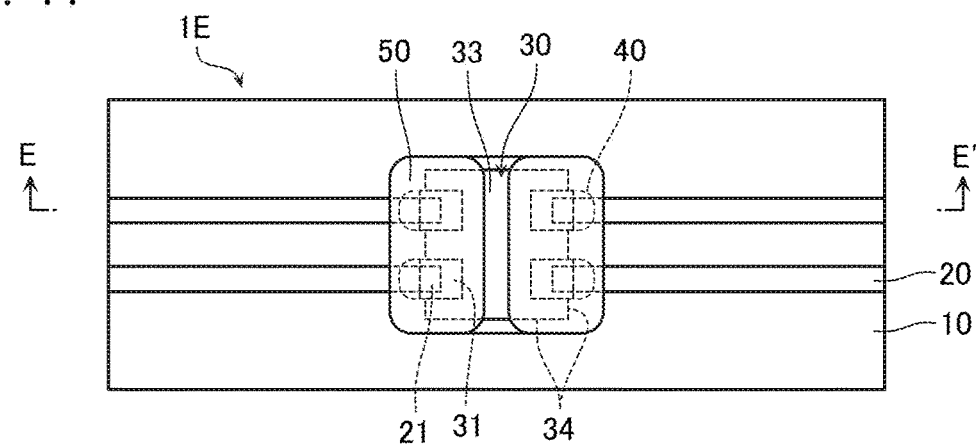
FIG. 11 is a plan view showing a stretchable circuit board according to a sixth embodiment of the present invention.
Figure 12:
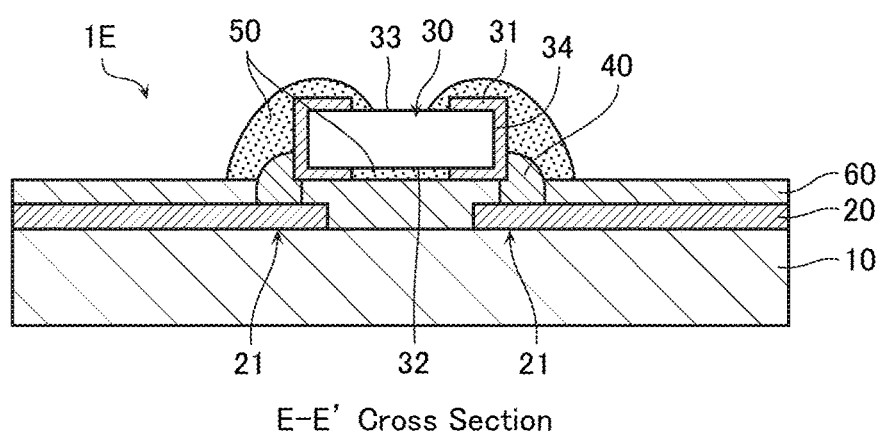
FIG. 12 is a cross-sectional view taken along the line E-E' of FIG. 11.

FIG. 11 is a plan view showing a stretchable circuit board 1E according to a sixth embodiment of the present invention. Moreover, FIG. 12 is a cross-sectional view taken along the line E-E' of FIG. 11. Note that in FIG. 11, illustration of the stretchable insulating film 60 is omitted. In FIGS. 11 and 12, configuring elements identical to those of the fifth embodiment will be assigned with reference numerals identical to those assigned in the fifth embodiment, hence duplicated descriptions thereof will be omitted below.

As shown in FIGS. 11 and 12, in the stretchable circuit board 1E according to the sixth embodiment, the covering section 50 is formed so as to not only cover the connecting section 40 but to further cover also part of the back surface 33 of the electronic component 30. This differs from the covering section 50 being formed so as to cover all of the side surfaces 34 and the spatial region in the stretchable circuit board 1D of the above-mentioned fifth embodiment.

This kind of configuration also enables stretchability and flexibility of the stretchable circuit board 1E overall to be secured, enables high density mounting of the electronic component 30, and enables the electronic component 30 to be reliably mounted on the stretchable circuit board 1E.

Seventh Embodiment

Figure 13:
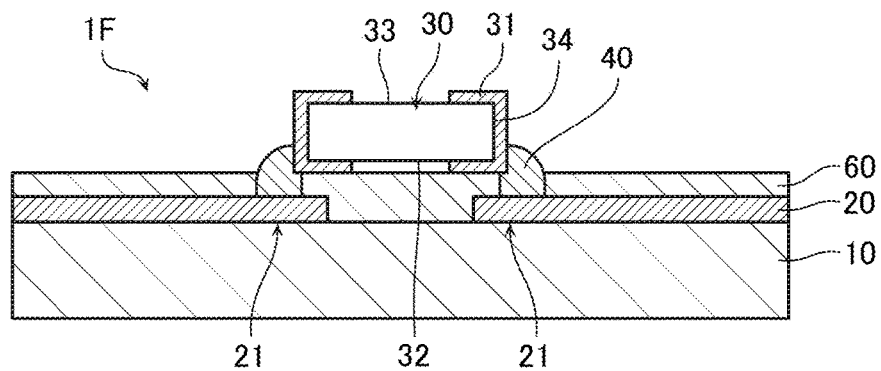
FIG. 13 is a cross-sectional view showing a stretchable circuit board according to a seventh embodiment of the present invention.

FIG. 13 is a cross-sectional view showing a stretchable circuit board 1F according to a seventh embodiment of the present invention. In FIG. 13, configuring elements identical to those of the first embodiment will be assigned with reference numerals identical to those assigned in the first embodiment, hence duplicated descriptions thereof will be omitted below.

As shown in FIG. 13, in the stretchable circuit board 1F according to the seventh embodiment, the covering section 50 not being provided differs from the covering section being provided in the stretchable circuit board 1 according to the first embodiment. Even when, in this way, the covering section 50 is not provided, stretchability and flexibility of the stretchable circuit board 1F overall is secured, and high density mounting of the electronic component 30 is enabled.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

DESCRIPTION OF REFERENCE NUMERALS 1 stretchable circuit board
10 stretchable base
20 stretchable wiring
21 wiring terminal
30 electronic component
31 connecting terminal
32 mounting surface
33 back surface
34 side surface
40 connecting section
50 covering section

The invention claimed is:

1. A stretchable circuit board, comprising: a stretchable base;
a stretchable wiring formed on the stretchable base;
an electronic component mounted on the stretchable base;
a connecting section that electrically connects between the electronic component and the stretchable wiring, and is stretchable and formed such that its Young's modulus is greater than or equal to that of the stretchable wiring: and
a covering section formed so as to cover at least the connecting section;
wherein the covering section is formed such that its Young's modulus is higher than the Young's modulus of the connecting section; and wherein the covering section is formed such that its Young's modulus is less than 1 GPa and two or more times the Young's modulus of the connecting section.

2. The stretchable circuit board according to claim 1, wherein
the connecting section is formed such that its Young's modulus is less than 1 GPa and two or more times the Young's modulus of the stretchable wiring.

3. The stretchable circuit board according to claim 1, wherein
the covering section is formed so as to continuously wrap around a spatial region between a mounting surface of the electronic component and the stretchable base, from a place covering a side surface of the electronic component, so as to fill at least part of the spatial region and cover at least the connecting section.

4. The stretchable circuit board according to claim 1, wherein
the connecting section is formed by a mixture of a first elastomer and a first conductive material.

5. The stretchable circuit board according to claim 4, wherein
the stretchable wiring is formed by a mixture of a second elastomer and a second conductive material.

6. The stretchable circuit board according to claim 5, wherein
the Young's modulus of the first elastomer is higher than the Young's modulus of the second elastomer.

7. The stretchable circuit board according to claim 5, wherein
the Young's modulus of the first conductive material is higher than the Young's modulus of the second conductive material.

8. The stretchable circuit board according to claim 1, wherein the covering section is formed so as to continuously wrap around a spatial region between a mounting surface of the electronic component and the stretchable base, from a place covering a side surface of the electronic component, so as to fill at least part of the spatial region and cover at least the connecting section.

* * * * *